United States Patent
Wang et al.

(10) Patent No.: US 7,829,264 B1
(45) Date of Patent: Nov. 9, 2010

(54) METHOD AND SYSTEM FOR PROVIDING A MICROELECTRONIC DEVICE USING A PLURALITY OF FOCUS DISTANCES

(75) Inventors: Yizhong Wang, Woodbury, MN (US); Hai Sun, Milpitas, CA (US); Hongping Yuan, Fremont, CA (US); Winnie Yu, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 607 days.

(21) Appl. No.: 11/836,629

(22) Filed: Aug. 9, 2007

(51) Int. Cl.
*G03F 7/20* (2006.01)
(52) U.S. Cl. .................. 430/311; 430/319
(58) Field of Classification Search ............ 430/311, 430/319, 320
See application file for complete search history.

(56) References Cited

U.S. PATENT DOCUMENTS

| | | | |
|---|---|---|---|
| 5,843,521 A * | 12/1998 | Ju et al. .................. 428/336 |
| 6,218,077 B1 | 4/2001 | Jin |
| 6,515,824 B1 * | 2/2003 | Sato .................. 360/125.44 |
| 7,038,762 B2 * | 5/2006 | Boettiger et al. .............. 355/53 |
| 7,444,740 B1 * | 11/2008 | Chung et al. ............. 29/603.16 |
| 2006/0256314 A1 | 11/2006 | Nolscher et al. |
| 2006/0268248 A1 | 11/2006 | Noelscher |

FOREIGN PATENT DOCUMENTS

| | | | |
|---|---|---|---|
| JP | 08-227850 | * | 9/1996 |
| JP | 2005-158819 | * | 6/2005 |

* cited by examiner

*Primary Examiner*—Kathleen Duda
*Assistant Examiner*—Caleen O Sullivan

(57) ABSTRACT

A method and system for providing a microelectric device are described. The method and system include providing a photoresist layer having a surface. The method and system also include setting a focus range and exposing the photoresist layer over the focus range to form a photoresist mask having a trench therein. The focus range corresponding to a plurality of focus distances. The focus range also corresponds to a nonzero angle to be formed in the photoresist layer and to the structure. The trench has at least one sidewall that forms the angle with a normal to the surface. The method and system also include providing the structure utilizing the trench.

23 Claims, 11 Drawing Sheets

METHOD AND SYSTEM FOR PROVIDING A MICROELECTRONIC DEVICE USING A PLURALITY OF FOCUS DISTANCES

BACKGROUND

FIG. 1 depicts a conventional method 10 for fabricating a conventional perpendicular magnetic recording (PMR) pole of a conventional PMR transducer. FIGS. 2-4 depict the conventional PMR head 30 during fabrication using the conventional method 10 as viewed from the air-bearing surface (ABS). For clarity, the conventional PMR head 30 is not to scale. Referring to FIGS. 1-4, the method 10 commences after formation of an alumina underlayer. The conventional method 30 starts after the PMR pole layer has been deposited. Thus, the magnetic material(s) to be used for the PMR pole have been deposited on the conventional PMR head 30. A photoresist layer is provided, via step 12. The photoresist layer is exposed using a single focus distance, otherwise known as a fixed focus offset, for the entire exposure, via step 14. In step 14, the wafer on which the conventional PMR head 30 is formed and reticle (not shown) used are not moved with respect to each other during the exposure. A photoresist mask having trench(es) therein is thus formed in step 14. FIG. 2 depicts the conventional PMR head 30 after step 14 is completed. Thus, a conventional PMR pole layer 32 formed on an underlayer 31, such as aluminum oxide, and photoresist mask 34 are shown. The photoresist mask 34 includes a trench 36 therein.

A hard mask is plated, via step 16. Also in step 16, the photoresist mask 34 may be removed after hard mask deposition. FIG. 3 depicts the conventional PMR head 30 after step 16 is completed. Thus, a hard mask 38 that has been formed in the trench (not shown in FIG. 3) has been fabricated. A pole trim is performed, via step 18. The pole trim utilizes the hard mask 38 as a mask. FIG. 4 depicts the conventional PMR head 30 after step 18 is performed. Thus, the PMR pole 32' has been formed from the PMR pole layer 32. Because of the presence of the hard mask 38 and the manner in which the pole trim is performed, the conventional PMR pole 32' has a negative angle. Stated differently, the top of the conventional PMR pole 32' is wider than the bottom of the conventional PMR pole 32'. Typically, this angle, θ, is desired to be eight degrees, plus or minus approximately one degree. Fabrication of the conventional PMR head 30 may then be completed.

FIG. 5 depicts another conventional method 50 for fabricating a conventional PMR pole of a conventional PMR transducer. FIGS. 6-8 depict the conventional PMR head 70 during fabrication using the conventional method 50 as viewed from the ABS. For clarity, the conventional PMR head 70 is not to scale. Referring to FIGS. 5-8, the method 50 commences after formation of an alumina underlayer. A dyed photoresist layer is provided on an underlayer, via step 52. For dyed photoresist, the removal of the photoresist depends upon the intensity of light reaching the photoresist. Consequently, portions of the photoresist closer to the underlayer are less likely to be removed. The dyed photoresist layer is exposed using a single focus distance, or a fixed focus offset, for the entire exposure, via step 54. During step 54, the wafer on which the conventional PMR head 70 is formed and reticle (not shown) used are not moved with respect to each other. A photoresist mask having trench(es) therein is thus formed in step 54. Furthermore, because the photoresist is dyed, less photoresist is removed closer to the underlayer. As a result, the trench(es) have angled sidewalls. FIG. 6 depicts the conventional PMR head 70 after step 54 is completed. Thus, a dyed photoresist mask 72 is formed on an underlayer 71, such as aluminum oxide. The photoresist mask 72 includes a trench 74 having angled sidewalls 75 and 76.

The material for the conventional PMR pole is plated, via step 56. FIG. 7 depicts the conventional PMR head 70 after step 56 is completed. Thus, the PMR pole layer 78 has been formed in the trench 74. Because the sidewalls 75 and 76 are angled, the PMR pole layer 78 has a negative angle. Stated differently, the top of the conventional PMR pole layer 78 is wider than the bottom of the conventional PMR pole layer 78. Typically, this angle, θ, is desired to be eight degrees, plus or minus approximately one degree. A pole trim may be performed, via step 58. Step 58 also includes removing the photoresist mask 72 prior to performing the pole trim. FIG. 8 depicts the conventional PMR head 70 after step 58 is performed. Thus, the PMR pole 78' has been formed from the PMR pole layer 78. Fabrication of the conventional PMR head 7 may then be completed.

Although the conventional methods 10 and 50 and the conventional PMR heads 30 and 70 function, there are drawbacks. For example, it may be difficult to achieve the desired angle using either using the hard mask 38 or the dyed photoresist mask 72 in the methods 10 and 50, respectively. Other methods for controlling the angle θ may adversely impact the photolithography process window. As a result, the angle, θ, may be different from what is desired. Such a difference may adversely affect performance of the conventional PMR heads 30 and 70.

Accordingly, what is needed is a system and method for improving the fabrication of a PMR head.

BRIEF SUMMARY OF THE INVENTION

A method and system for providing a microelectric device are described. The method and system include providing a photoresist layer having a surface. The method and system also include setting a focus range and exposing the photoresist layer over the focus range to form a photoresist mask having a trench therein. The focus range corresponding to a plurality of focus distances. The focus range also corresponds to a nonzero angle to be formed in the photoresist layer and to the structure. The trench has at least one sidewall that forms the angle with a normal to the surface. The method and system also include providing the structure utilizing the trench. In another aspect, the method and system include providing a photoresist layer and exposing the photoresist layer over a focus range to form a photoresist mask having a trench therein. The focus range corresponds to a plurality of focus distances. The trench has at least one sidewall having a nonzero angle. In this aspect, the method and system also include providing a perpendicular magnetic recording (PMR) pole utilizing the trench.

DETAILED DESCRIPTION OF THE PREFERRED EMBODIMENTS

Figure 1:
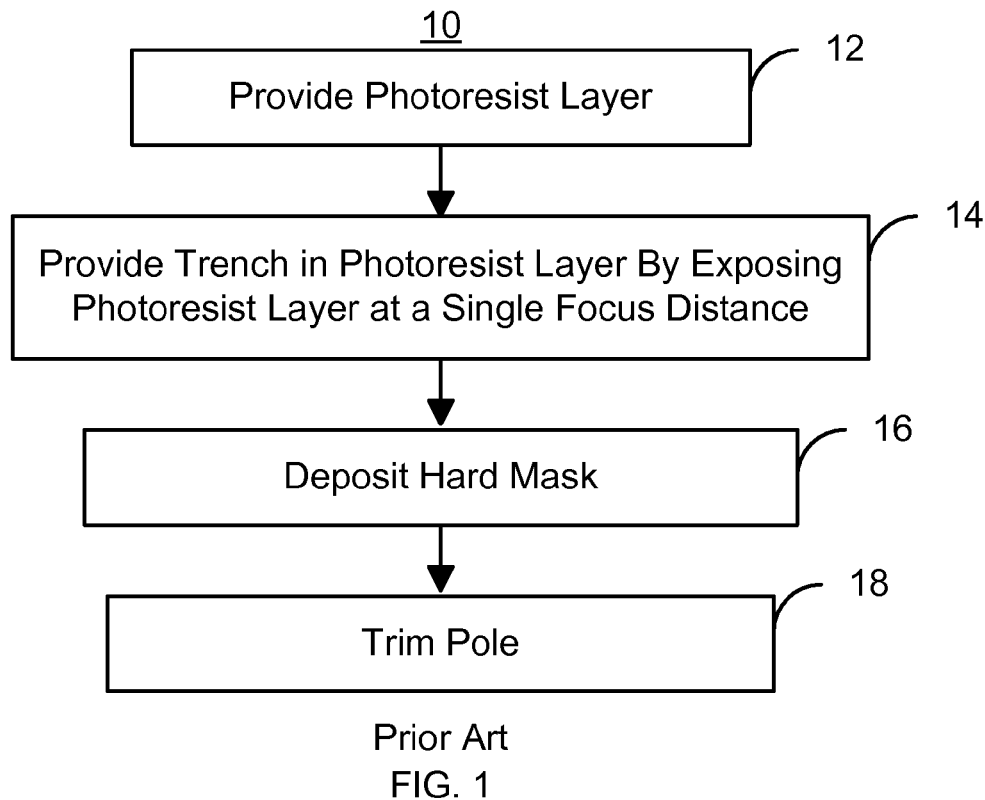
FIG. 1 is a flow chart depicting a conventional method for providing a conventional PMR head.
Figure 2:
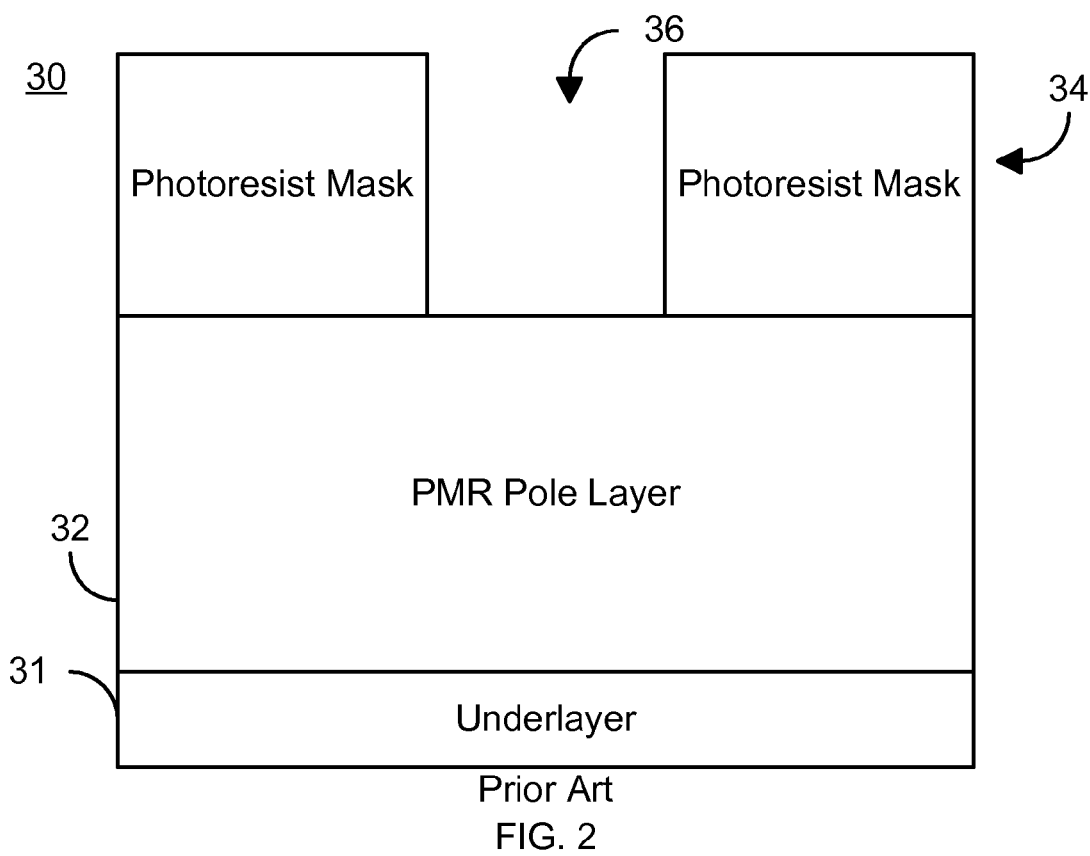
FIGS. 2-4 depict a conventional perpendicular magnetic recording head during fabrication.
Figure 3:
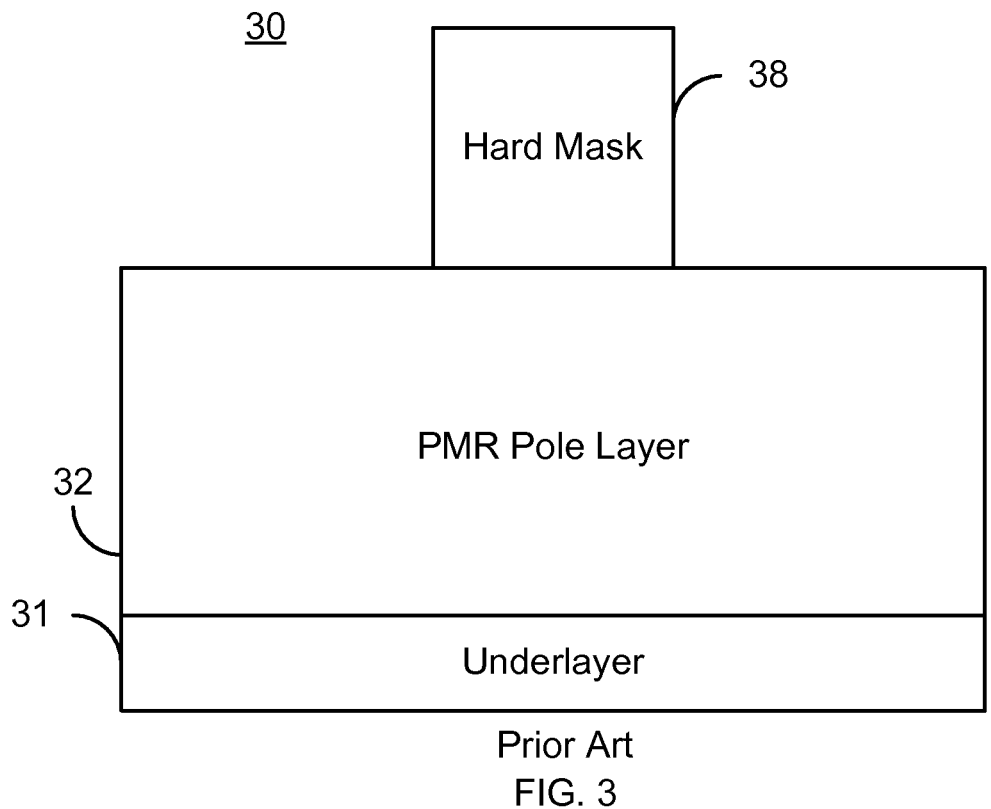
Figure 4:
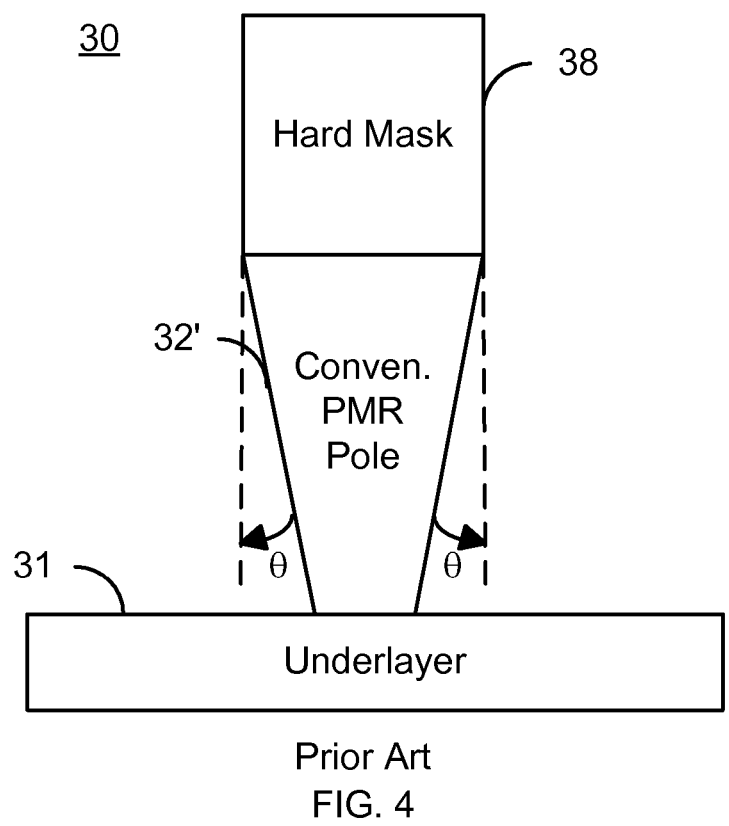
Figure 5:
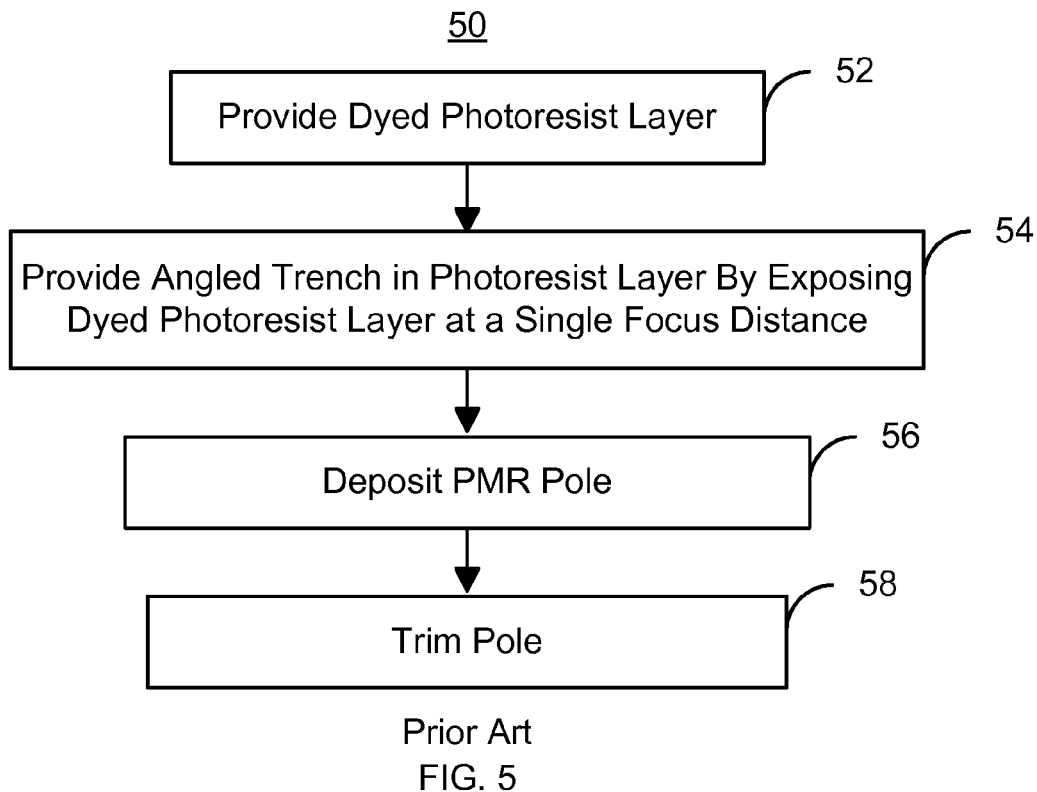
FIG. 5 is a flow chart depicting another conventional method for providing a conventional PMR head.
Figure 6:
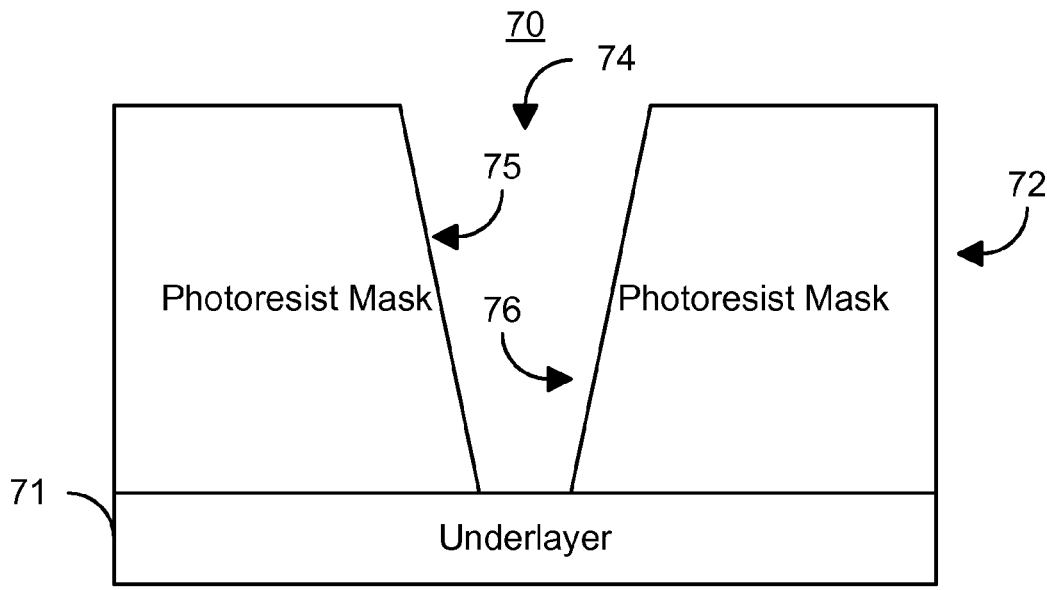
FIGS. 6-8 depict another conventional perpendicular magnetic recording head during fabrication.
Figure 7:
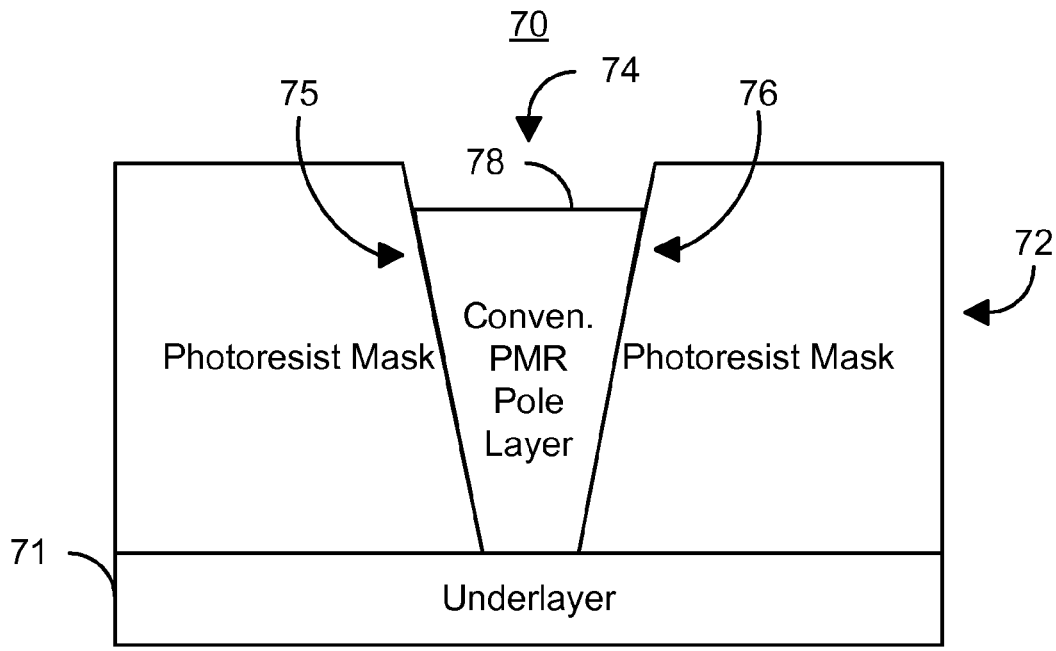
Figure 8:
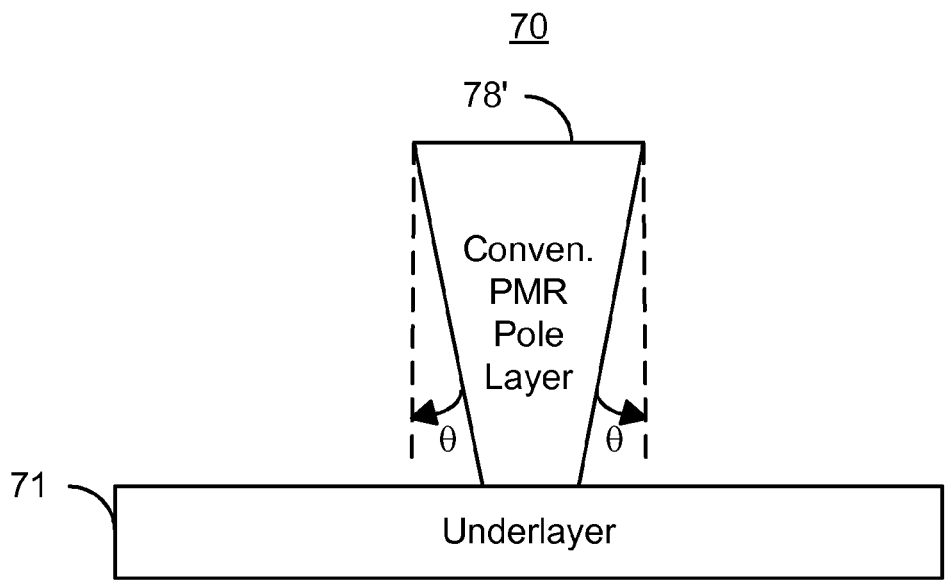
Figure 9:
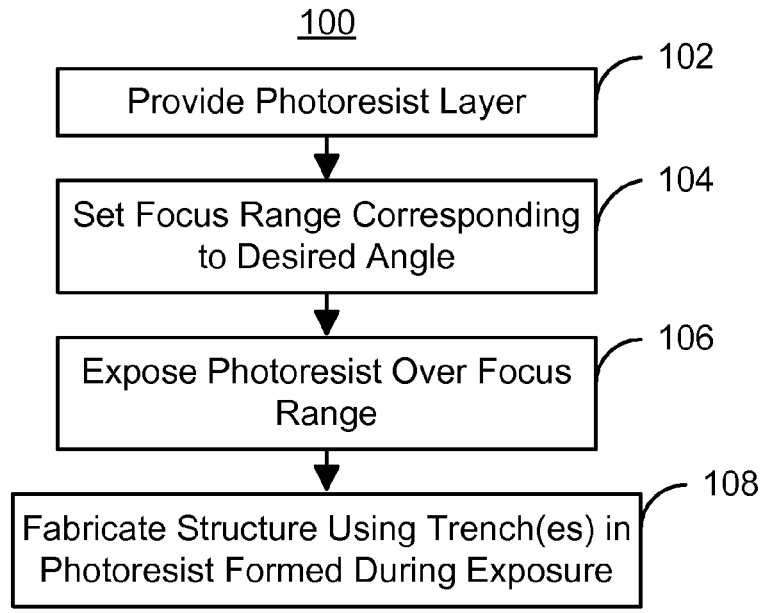
FIG. 9 is a flow chart depicting an exemplary embodiment of a method for providing a structure in a microelectric device
Figure 10A:
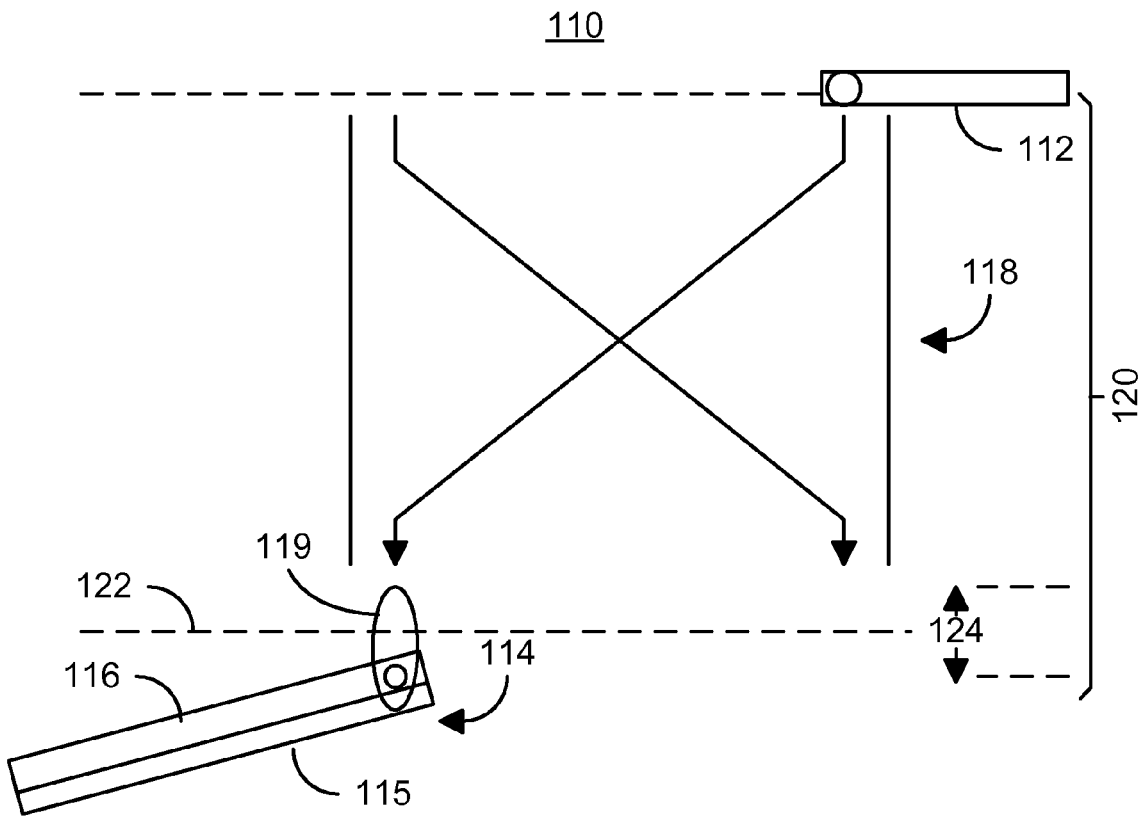
FIGS. 10A-10C depicts an exemplary embodiment of a microelectic device undergoing exposure of photoresist at a plurality of focus distances.
Figure 10B:
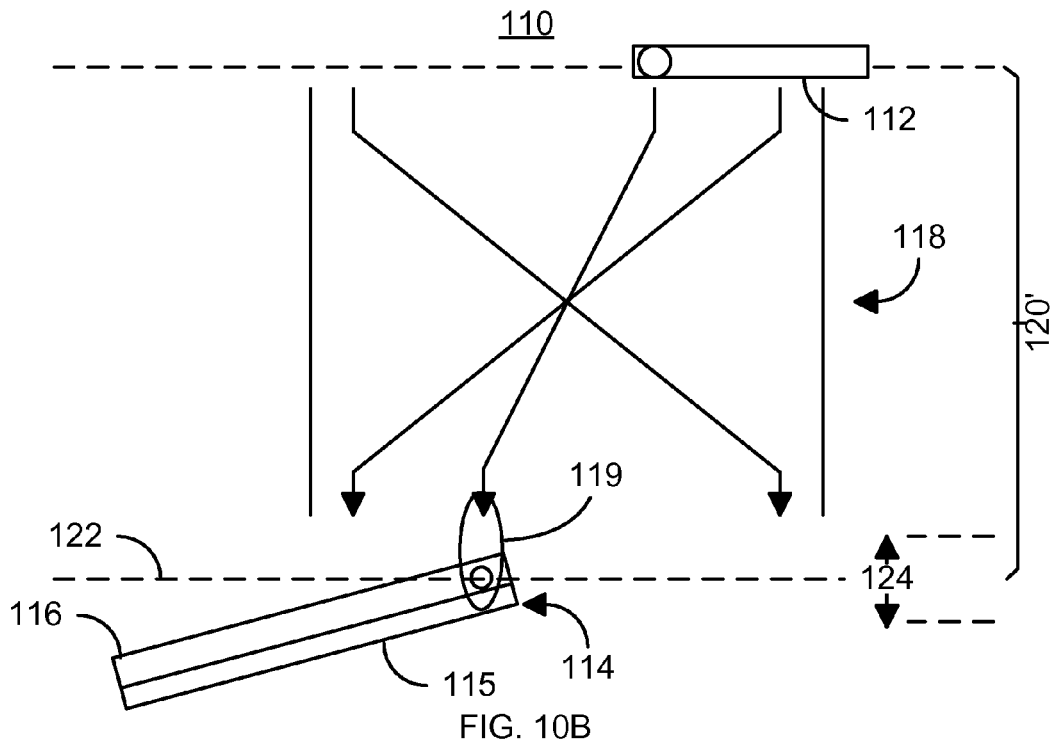
Figure 10C:
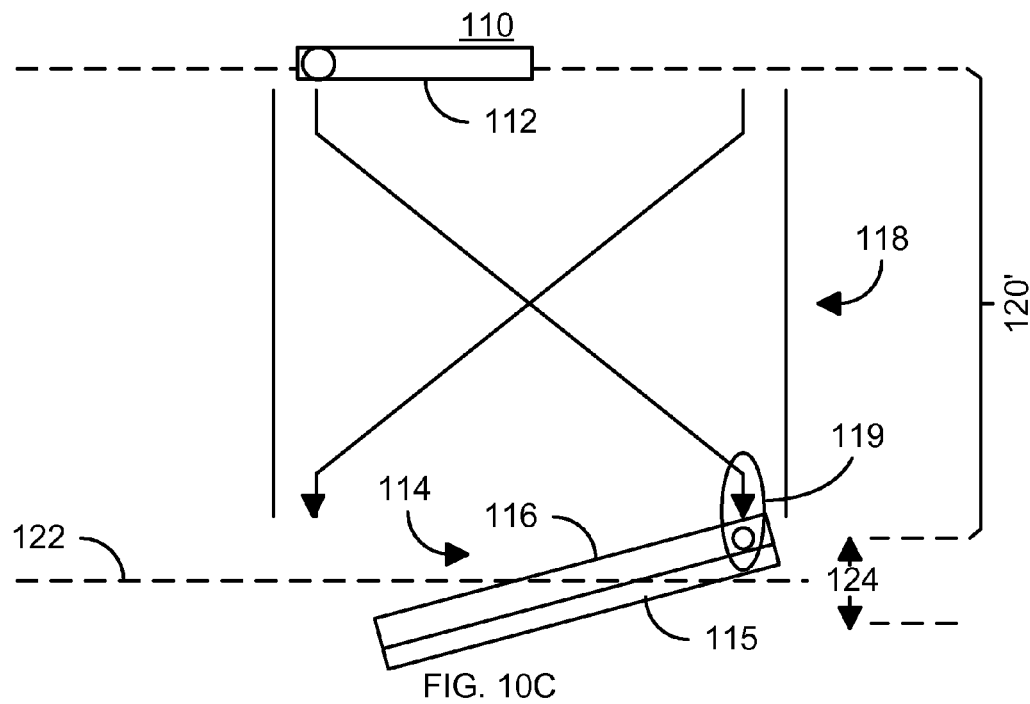

FIG. 9 is a flow chart depicting an exemplary embodiment of a method 100 for fabricating a structure in a microelectric device, such as a PMR head. For simplicity, some steps in the method 100 may be omitted. Consequently, other and/or additional steps not inconsistent with the method and system may be used. The method 100 is described in the context of and preferably used for providing a PMR pole of a PMR head. However, in another embodiment, the method 100 may be used in providing another structure that may be in another type of head and/or another type of microelectric device. For example, the method 100 may be used in providing a conductive line. FIGS. 10A-10C depict an exemplary embodiment of the set-up 110 for a microelectric device 114 undergoing exposure of photoresist at a plurality of focus distances using the method 100. For simplicity, the system 110 and its components are not to scale.

Referring to FIGS. 9 and 10A-10C, a photoresist layer is provided on the microelectric device, via step 102. The photoresist layer provided in step 102 might be a dyed photoresist layer. In such an embodiment, the trench(es) provided (described below) may have a larger angle on the sidewalls. A focus range corresponding to an angle to be formed in the photoresist layer is set, via step 104. The focus range corresponds to multiple focus distances. The angle corresponds to a desired angle in the structure being formed. In some embodiments, the angle may be an angle existing in the structure being fabricated. In other embodiments, the angle may be an angle in, for example, a mask that is used to provide another angle in the structure being formed. The relationship between the focus range and the angle formed may be determined empirically. This relationship between the focus range and angle is generally repeatable and, once determined, predictable. For example, in one embodiment, a focus range of up to two microns corresponds to the angle, θ, being up to three degrees greater than a constant focus distance angle. The constant focus distance angle is the angle that would have been formed had a single focus distance been used in lieu of the focus range. The focus range and angle may have differing relationships for different tools, reticles, microelectric devices and other portions of the system 110 used to perform the exposure.

The photoresist layer is exposed over the selected focus range to form a photoresist mask having trench(es) therein, via step 106. Exposing the photoresist layer over the range may include stepping between different focus distances. In such an embodiment, the photoresist layer may be exposed for a portion of the desired exposure, the relative distance between the reticle and microelectric device changed by a discrete amount, then the photoresist layer may be exposed again for another portion of the desired exposure. In another embodiment, the exposure in step 106 may be achieved by scanning substantially continuously through the focus distances in the focus range. Changes in the focus distance may be achieved, for example, by affixing the microelectric device to a stage, tilting at least a portion of the stage such that the normal to the surface of the microelectric device makes a nonzero angle with a direction of travel of the light used for the exposure, and moving the stage in the direction during the exposing of the photoresist layer. Because the focus range was selected, sidewalls of the trench(es) may have the desired angle.

FIGS. 10A-10C depict an exemplary embodiment of a setup 110 for performing step 106. The microelectric device 116 includes an underlayer 115 and utilizes a photoresist layer 116 that is exposed in step 106. In one embodiment, the thickness of the photoresist layer 116 is relatively high. For example, the photoresist layer 116 may have a thickness of at least 0.5 micrometers. In another embodiment, the photoresist layer 116 may have a thickness of at least one micrometer. Also shown in FIGS. 10A-10C are a projection lens 118, a reticle 112, and an image 119 formed during the exposure. In the embodiment 110 shown in FIGS. 10A-10C, changes in the vertical focus distance are achieved by tilting the device 114 and moving the device 114 in a direction perpendicular to the direction of travel of light used in the exposure (i.e. moving horizontally in FIGS. 10A-10C). However, in another embodiment, another method for changing the focus distance may be selected. Note that in FIGS. 10A-10C, three different focus distances 120, 120', and 120" are shown. However, the exposure performed in step 106 may be at another number of focus distances over the focus range 124. For example, in one embodiment the system 110 may be stepped through another, discrete number of focus distances within the range 124. In an alternate embodiment, the focus distances may be substantially continuously scanned through.

FIG. 10A depicts the microelectric device 114 at a first focus distance 120. As can be seen in FIG. 10A, the focus distance 120 for the microelectric device 114 is greater than the best focus distance 122 for the portion of the exposure shown in FIG. 10A. FIG. 10B depicts the setup 110 when the microelectric device 114 is at a second focus distance 120'. The focus distance 120' is substantially at the best focus distance 122 for the portion of the exposure shown in FIG. 10B. FIG. 10C depicts the setup 110 when the microelectric device 114 is at a third focus distance 120". The focus distance 120" is less than the best focus distance for the portion of the exposure shown in FIG. 10C. Thus, the photoresist layer 116 is exposed over the focus range 124 and trench(es) 126 provided. The sidewalls of the trench(es) 126 make a nonzero angle with a normal to the surface of the photoresist layer 116. In particular, the angle of the sidewalls is different from the angle that would have been formed in a fixed focus distance exposure by an angle that depends upon the focus range selected.

The desired structure is provided utilizing the trench(es) 126, via step 108. In one embodiment, step 108 includes filling the trench(es) 126 with the desired material(s) for the structure. For example, a PMR pole or conductive line might be formed by plating or otherwise depositing magnetic or conductive material(s), respectively, in the trench(es) 126. In such a case, the angle formed in step 106 may be present in the PMR pole or conductive line. Further trimming of the PMR pole or other structure may then further tailor the angle of the sidewalls. In another embodiment, step 108 includes using the trench(es) 126 for another purpose in fabricating the structure. For example, the trench(es) 126 may be filled with a hard mask used in trimming the PMR pole. In either case, the angle of the sidewalls of the PMR pole depend upon the angle of the sidewall(s) of the trench(es). Fabrication of the microelectric device may then be completed.

Thus, using the method 100, a photoresist mask including trench(es) 126 having angles that are selected using the focus range may be formed. Better targeting and control for a larger range of angles for the trench(es) may be provided. As a result, better targeting and control over the angles of the structures being fabricated may be accomplished. Consequently, performance of the microelectric device, such as a PMR head, may be achieved.

Figure 11:
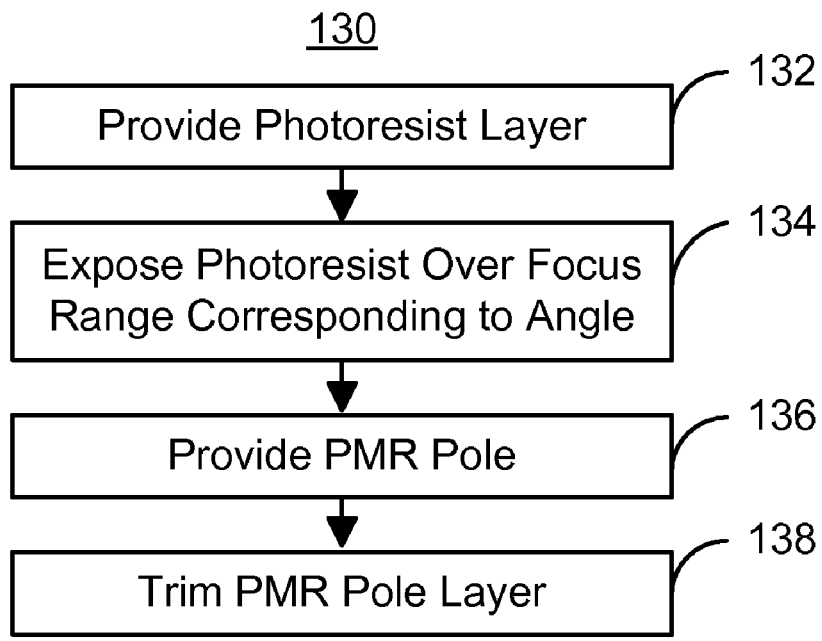
FIG. 11 is a flow chart depicting an exemplary embodiment of a method for providing a structure in a write head.

FIG. 11 is a flow chart depicting an exemplary embodiment of a method 130 for fabricating a structure, such as a PMR pole, in a magnetic head. For simplicity, some steps in the method 130 may be omitted. Consequently, other and/or additional steps not inconsistent with the method and system may be used. The method 130 is described in the context of and preferably used for providing a PMR pole of a PMR head. However, in another embodiment, the method 130 may be used in providing another structure that may be in another type of head. For example, the method 130 may be used in providing a conductive line in a write head.

A photoresist layer is provided on the PMR head, via step 132. In one embodiment, the photoresist layer is provided on material used to provide the PMR pole. In another embodiment, the photoresist layer may be provided on another layer, such as an underlayer for the PMR pole. The photoresist layer provided in step 132 may be a dyed photoresist layer. In such an embodiment, the trench(es) provided (described below) may have a larger angle on the sidewalls than may be achieved using the dyed photoresist and a single focus distance.

The photoresist layer is exposed over a focus range corresponding to an angle, via step 134. The focus range corresponds to multiple focus distances. The angle corresponds to a desired angle in the structure, such as a PMR pole, being formed. Thus, in some embodiments, the angle may be an angle existing in the PMR pole being fabricated. In other embodiments, the angle may be an angle in, for example, a hard mask that is used to provide another angle in the PMR pole. The relationship between the focus range and the angle formed may be determined empirically and is repeatable, as described above. For example, in one embodiment, a focus range of up to two microns corresponds to the angle, $\theta$, up to three degrees greater than a constant focus distance angle. Step 134 may include stepping between different focus distances and/or scanning substantially continuously through multiple distances. Step 134 is thus analogous to step 106 of the method 100 depicted in FIG. 9. Referring back to FIG. 11, because the focus range was used, sidewalls of the trench(es) may have the desired angle.

The desired PMR pole is provided utilizing the trench(es), via step 136. In one embodiment, step 134 includes filling the trench(es) 126 with the magnetic material(s) for the PMR pole. Further trimming of the PMR pole may then further tailor the angle of the sidewalls. Such trimming may also be reduced. In another embodiment, step 136 includes using the trench(es) for another purpose in fabricating the structure. For example, the trench(es) may be filled with a hard mask and the hard mask used in trimming the PMR pole. In such a case, the angle of the sidewalls of the PMR pole depend upon the angle of the sidewall(s) of the trench(es). Fabrication of the PMR head may then be completed.

Thus, using the method 130, a PMR head having improved targeting and control of the angle of the PMR head may be achieved. In particular, an angle that is at least seven degrees and not more than nine degrees may be provided. Consequently, performance of the PMR head may be improved.

Figure 12:
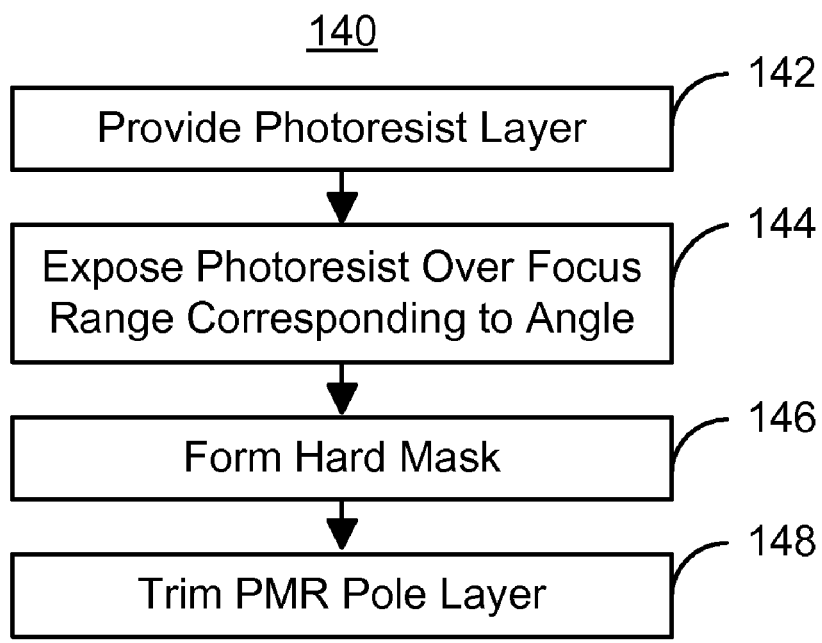
FIG. 12 is a flow chart depicting another exemplary embodiment of a method for providing a structure in a write head.
Figure 13:
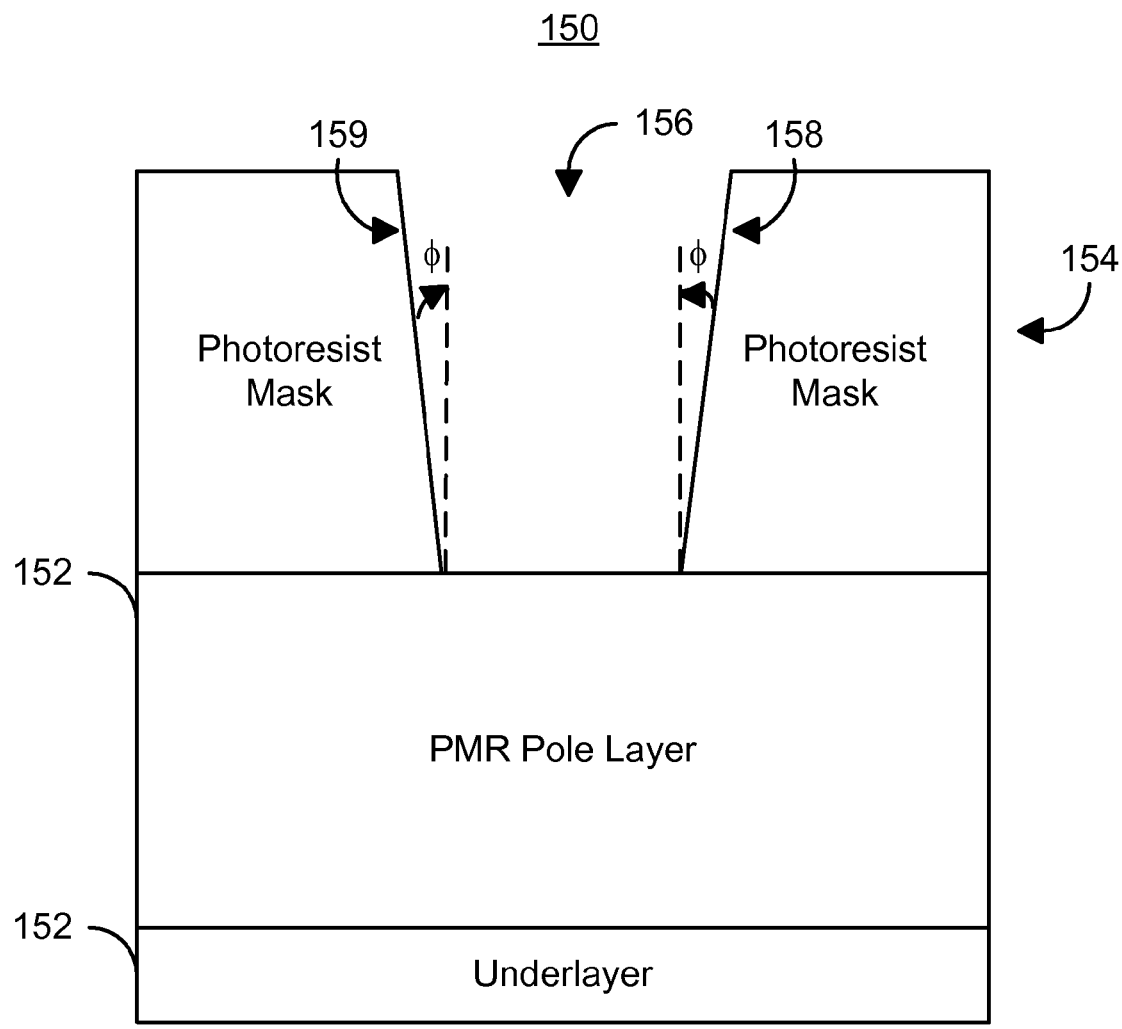
FIGS. 13-15 depict an exemplary embodiment of a perpendicular magnetic recording head during fabrication.
Figure 14:
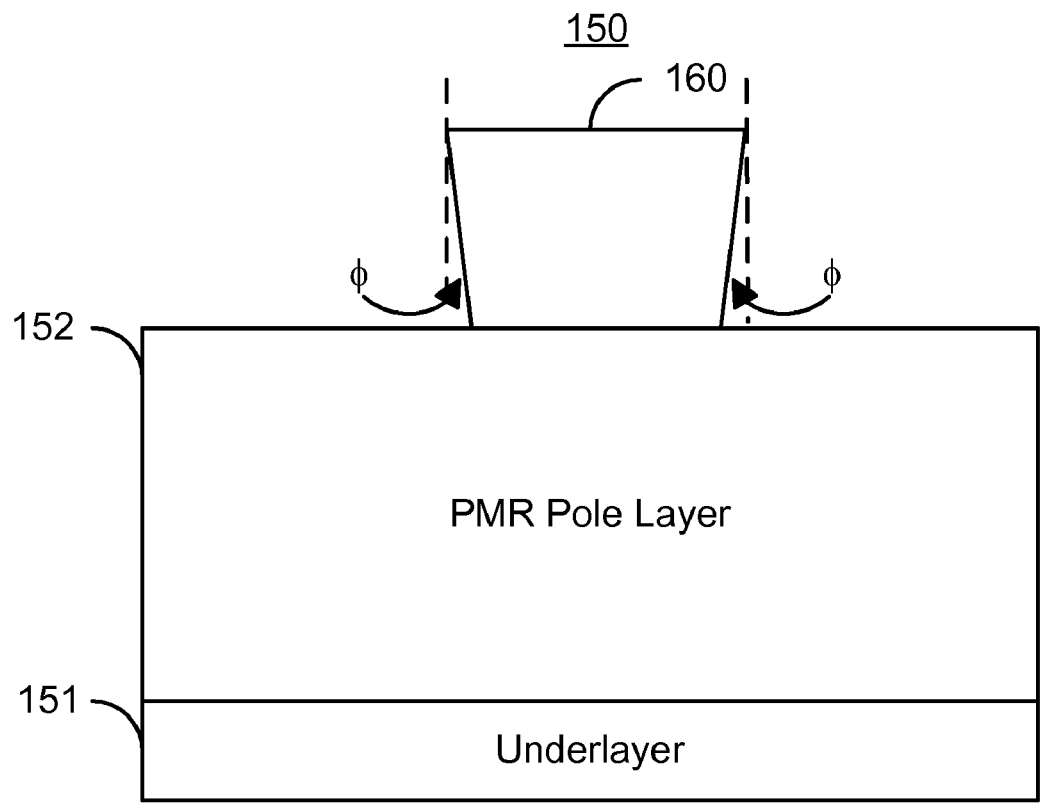
Figure 15:
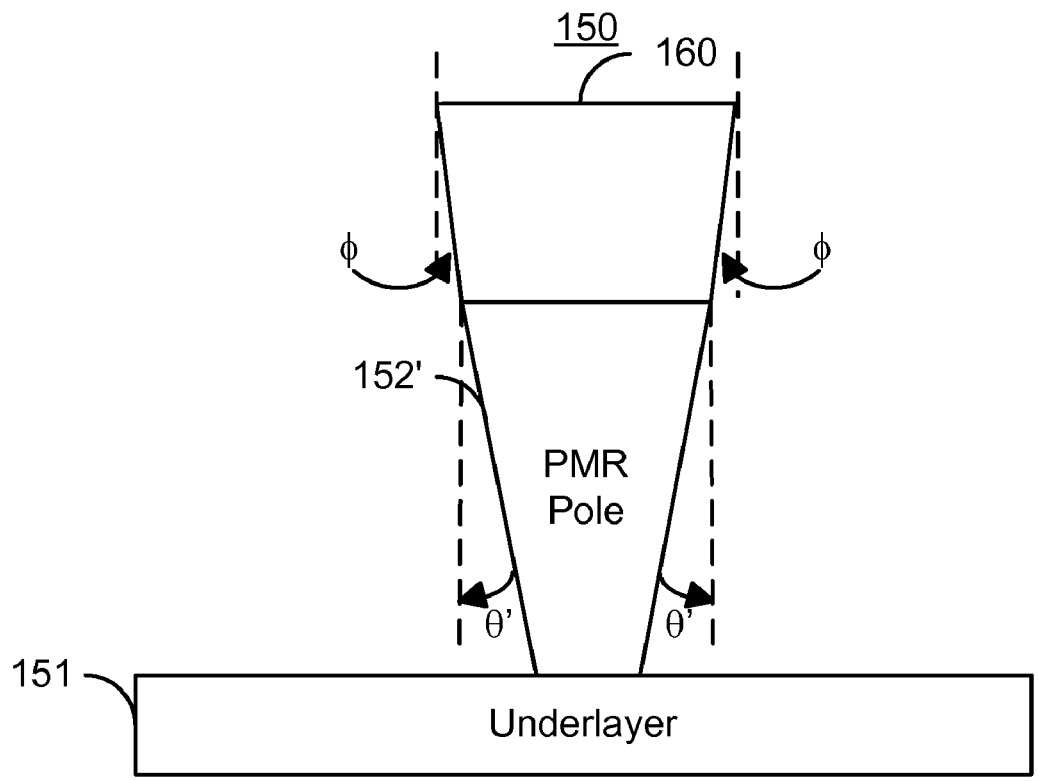

FIG. 12 is a flow chart depicting an exemplary embodiment of a method 140 for providing a structure in a PMR head. For simplicity, some steps in the method 140 may be omitted. Consequently, other and/or additional steps not inconsistent with the method and system may be used. In addition, the method 140 is described in the context of providing a PMR pole. However, in another embodiment, another structure may be provided. FIGS. 13-15 depict an exemplary embodiment of forming a PMR pole in a PMR head 150 during fabrication. The PMR head 150 may include a write transducer (not separately depicted) and a read transducer (not shown). For simplicity, the PMR head 150 and its components are not to scale. Referring to FIGS. 12-15, the method 140 commences after the magnetic material for the structure, such as a PMR pole, has been deposited. A photoresist layer is provided on the PMR head 150, via step 142. In one embodiment, the photoresist layer may be provided on the PMR pole material.

The photoresist layer is exposed over a focus range to form a photoresist mask, via step 144. The focus range corresponds to a plurality of focus distances. Step 144 is thus analogous to step 106 of the method 100 depicted in FIG. 9. Referring back to FIGS. 12-15, step 144 may include stepping between different focus distances at discrete intervals or scanning substantially continuously through the focus distances in the range. Changes in the focus distance may be achieved, for example, by affixing the PMR head to a stage, tilting at least a portion of the stage such that the normal to the surface of the PMR head makes a nonzero angle with a direction of travel of the light used for the exposure, and moving the stage in the direction during the exposing of the photoresist layer. Thus, step 144 may be achieved in a system analogous to the setup 110 shown in FIGS. 10A-10C. Referring back to FIGS. 12-15, FIG. 13 depicts the PMR head 150 after step 144 has been performed. The PMR head includes a PMR pole layer 152 formed on underlayer 151. A photoresist mask 154 including a trench 156 having sidewalls 158 and 159 resides on the PMR pole layer. Because a range of focus distances was used, the sidewalls 158 and 159 have an angle, $\phi$, with respect to normal to the surface. The angle $\phi$ is nonzero so that the sidewalls 158 and 159 are not vertical. This may occur even when dyed photoresist is not used.

A hard mask is formed using the photoresist mask 154 as a mask, via step 146. Step 146 may be performed by plating or otherwise depositing layer(s) of hard mask material, then removing the photoresist mask 154. Thus, a portion of the hard mask residing in the trench remains. FIG. 14 depicts the PMR head 150 after step 146 is performed. Thus, the photoresist mask 154 has been removed. In addition, a hard mask 160 has been formed where the trench 156 resided. Because it was formed in the trench 156, the hard mask 156 has an angle, $\phi$, matching that of the trench 156. In one embodiment, the angle $\phi$ is not the same as the desired angle for the PMR pole being formed. Thus, in one embodiment, the angle $\phi$ is not more than three degrees.

The PMR pole layer 152 is then trimmed to define the PMR pole, via step 148. In one embodiment, step 148 includes performing an ion mill utilizing the hard mask 160 as a mask. Thus, a portion of the PMR pole layer 152 exposed by the hard mask 160 is removed. The remaining portion of the PMR pole layer 152 forms the PMR pole. FIG. 15 depicts the PMR head 150 after step 148 has been performed. Thus, a PMR pole 152' has been formed from the PMR pole layer 152. The PMR pole 152' has a negative angle such that the top of the PMR pole 152' is wider than the bottom of the PMR pole 152'.

This angle, θ', is generally different from the angle φ of the hard mask 160. In one embodiment, the angle θ' is at least six and not more than ten degrees. In another embodiment, the angle θ' is at least seven and not more than nine degrees. Fabrication of the PMR head 150 may then be completed.

Thus, using the method 140, the PMR pole 152' may be formed. Because the sidewalls 158 and 159 of the trench 156 are not vertical, the walls of the hard mask 160 also make a nonzero angle φ with respect to vertical. Consequently, the pole trim performed in step 148 is better able to target and control the angle θ' of the PMR pole 152'. Consequently, performance of the PMR pole 152' may be improved.

Figure 16:
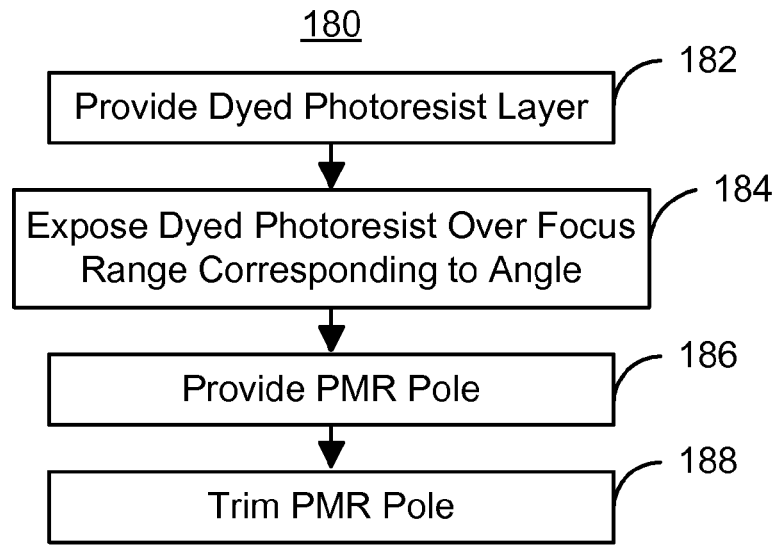
FIG. 16 is a flow chart depicting an exemplary embodiment of a method for providing a structure in a write head.
Figure 17:
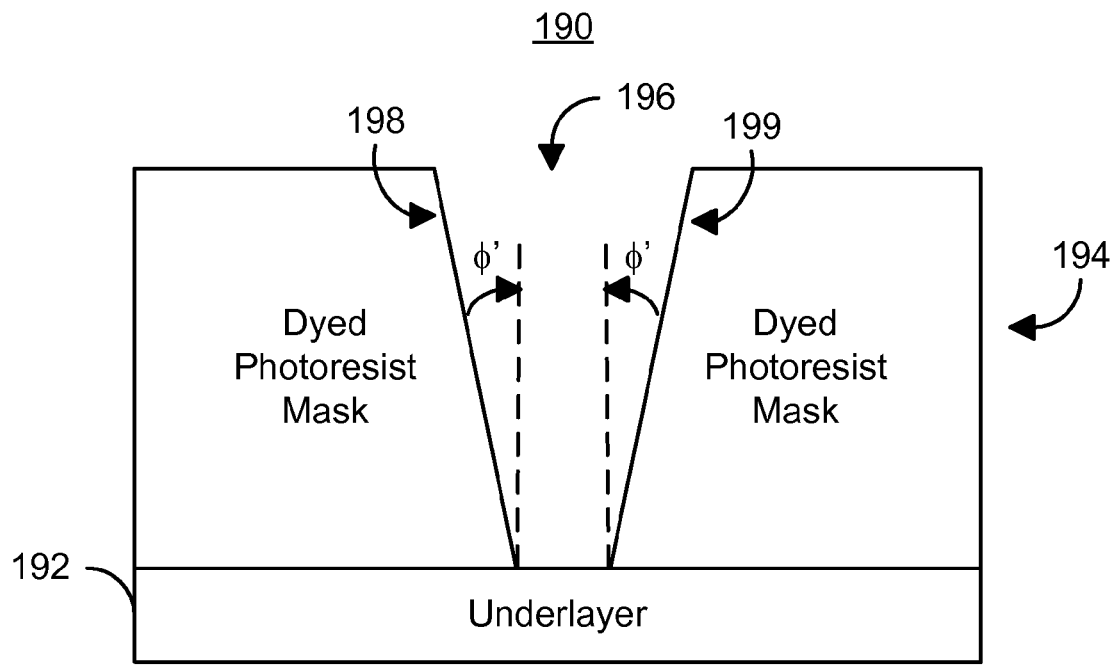
FIGS. 17-19 depict an exemplary embodiment of a perpendicular magnetic recording head during fabrication.
Figure 18:
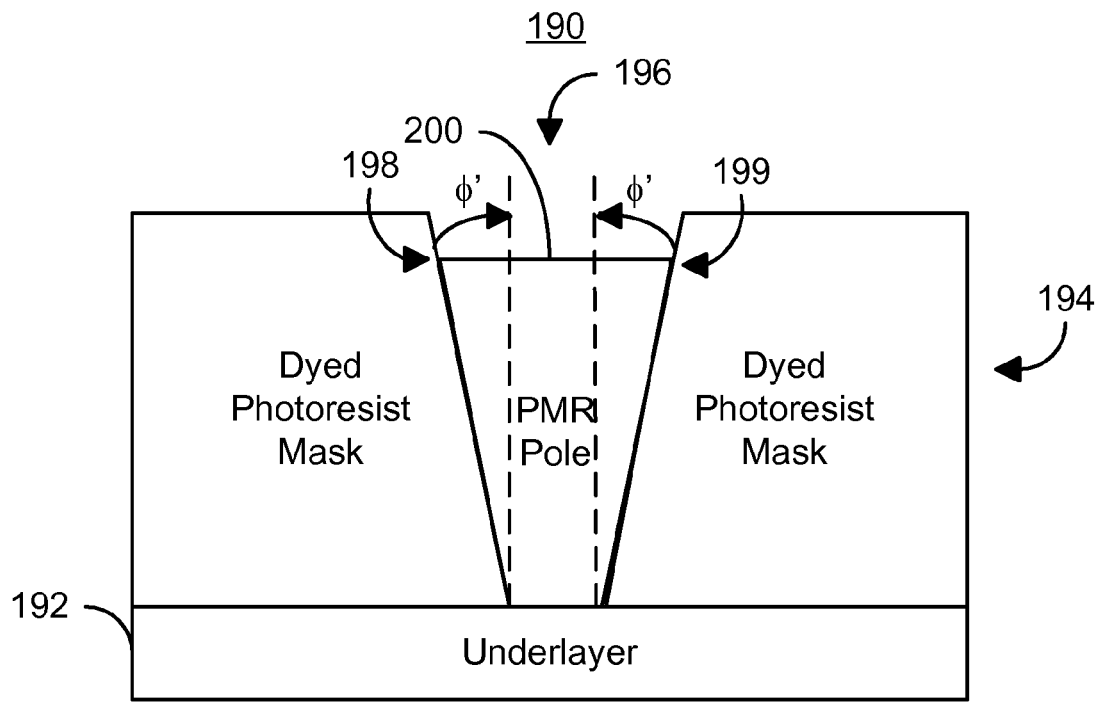
Figure 19:
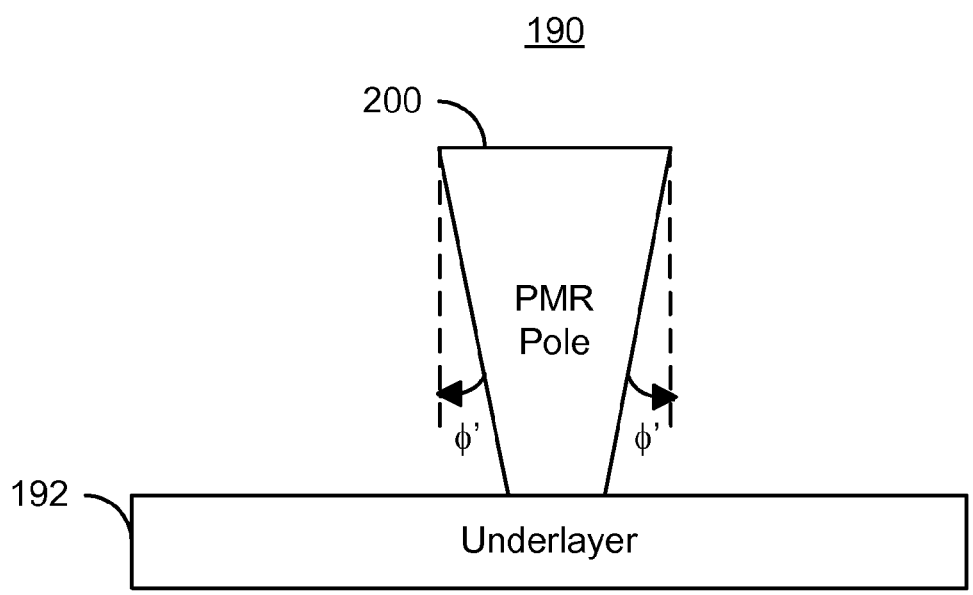

FIG. 16 is a flow chart depicting another exemplary embodiment of a method 180 for providing a structure in a PMR head. For simplicity, some steps in the method 180 may be omitted. Consequently, other and/or additional steps not inconsistent with the method and system may be used. In addition, the method 180 is described in the context of providing a PMR pole. However, in another embodiment, another structure may be provided. FIGS. 17-19 depict an exemplary embodiment of forming a PMR pole in a PMR head 190 during fabrication. The PMR head 190 may include a write transducer (not separately depicted) and a read transducer (not shown). For simplicity, the PMR head 190 and its components are not to scale. Referring to FIGS. 16-19, the method 180 commences after the underlayer for the structure, such as a PMR pole, has been deposited. A dyed photoresist layer is provided on the PMR head 190, via step 182. In one embodiment, the dyed photoresist layer may be provided on the aluminum oxide underlayer for the PMR pole. As described above, removal of a dyed photoresist depends upon the intensity of light reaching that portion of the photoresist. Portions of the dyed photoresist layer closer to the underlayer are less likely to be removed. As a result, the dyed photoresist layer provided in step 182 may have a trench having angled sidewalls even if a single, constant focus distance is used.

The dyed photoresist layer is exposed over a focus range to form a photoresist mask, via step 184. The focus range corresponds to a plurality of focus distances. Step 184 is thus analogous to step 106 of the method 100 depicted in FIG. 9. Referring back to FIGS. 16-19, step 184 may include stepping between different focus distances at discrete intervals or scanning substantially continuously through the focus distances in the range. Changes in the focus distance may be achieved, for example, by affixing the PMR head 190 to a stage, tilting at least a portion of the stage such that the normal to the surface of the PMR head 190 makes a nonzero angle with a direction of travel of the light used for the exposure, and moving the stage in the direction during the exposing of the photoresist layer. Thus, step 184 may be achieved in a system analogous to the setup 110 shown in FIGS. 10A-10C. Referring back to FIGS. 16-19, FIG. 17 depicts the PMR head 190 after step 184 has been performed. The PMR head includes an underlayer 192. A dyed photoresist mask 194 including a trench 196 having sidewalls 198 and 199 resides on the underlayer 192. Because a range of focus distances was used, the sidewalls 158 and 159 have an angle, φ', with respect to normal to the surface. The angle φ' is such that the sidewalls 198 and 199 are angled to a greater extent than if a single focus distance were used. Thus, the angle φ' may be at least six and not more than ten degrees. In another embodiment, the angle φ' may be at least seven and not more than nine degrees.

A PMR pole is formed using the dyed photoresist mask 194 as a mask, via step 186. Step 186 may be performed by plating or otherwise depositing layer(s) of magnetic material for the PMR pole, then removing the dyed photoresist mask 194. FIG. 18 depicts the PMR head 190 after the deposition of the material(s) for the PMR pole 200 in step 186 has been performed. Consequently, the PMR pole 200 is shown. Step 186 may also include removing the dyed photoresist mask 194. FIG. 19 depicts the PMR head 190 after the photoresist mask 194 has been removed. Thus, a PMR pole 200 has been formed where the trench 156 resided. Because it was formed in the trench 196, the PMR pole 200 has an angle, φ', matching that of the trench 196. Thus, in one embodiment, the angle φ' is at least six and not more than ten degrees or, in another embodiment, at least seven and not more than nine degrees.

The PMR pole 200 may be trimmed, via step 188. However, the trimming in step 188 may be significantly less than that in the method 150 or the conventional methods 10 and 50. For example, in one embodiment, step 188 does not significantly change the angle φ'.

Thus, using the method 180, the PMR pole 200 may be formed. Because the sidewalls 198 and 199 of the trench 196 are not vertical, the walls of the PMR pole 200 also make a nonzero angle φ' with respect to vertical that is at least close to the angle desired for the PMR pole 200. The angle of the PMR pole 200 may thus be better targeted and controlled. Consequently, performance of the PMR pole 200 may be improved.

Using the methods 100, 140, and 180, performance of a microelectric device such as a PMR head may be improved. For example, better targeting and control of the angle of the PMR pole 152'/200 may be achieved. Consequently, performance of the PMR head 110/190 may be improved.

We claim:

1. A method for providing a structure in a microelectronic device comprising:
   providing a photoresist layer having a surface;
   setting a focus range corresponding to an angle to be formed in the photoresist layer and corresponding to the structure;
   exposing the photoresist layer over the focus range to form a photoresist mask having a trench therein, the trench having at least one sidewall forming the angle with a normal to the surface, the angle being nonzero, the focus range corresponding to a plurality of focus distances; and
   providing the structure utilizing the trench.

2. The method of claim 1 wherein the focus range is up to two microns for the angle being up to three degrees from a constant focus distance angle.

3. The method of claim 1 wherein the photoresist layer has a thickness of at least 0.5 micrometers.

4. The method of claim 3 wherein the thickness is at least one micrometer.

5. The method of claim 1 wherein the microelectric device is a recording transducer.

6. The method of claim 5 wherein the structure is a perpendicular magnetic recording pole.

7. A method for providing a magnetic transducer comprising:
   providing a photoresist layer having a surface;
   exposing the photoresist layer over a focus range to form a photoresist mask having a trench therein, the trench having at least one sidewall having an angle with respect to a normal to the surface, the angle being nonzero, the focus range corresponding to a plurality of focus distances, the focus range being selected to correspond to the angle to be formed; and
   providing a perpendicular magnetic recording (PMR) pole utilizing the trench.

8. The method of claim 7 wherein the focus range is not more than two micrometers for the angle being not more than three degrees.

9. The method of claim 7 wherein the step of exposing the photoresist layer further includes:
stepping between the plurality of distances.

10. The method of claim 7 wherein the step of exposing the photoresist layer further includes:
scanning substantially continuously between the plurality of distances.

11. The method of claim 10 wherein the PMR transducer resides on a substrate and wherein the step of scanning further includes:
affixing the substrate to a stage;
tilting at least a portion of the stage such that the substrate makes an angle with a direction; and
moving the stage in the direction during the exposing of the photoresist layer.

12. The method of claim 7 further including:
forming a hard mask, a portion of the hard mask residing in the trench.

13. The method of claim 12 wherein the photoresist layer is on a PMR pole layer, and wherein step of providing the PMR pole further includes:
removing a first portion of the PMR pole layer utilizing the hard mask to cover a second portion of the PMR pole layer, the PMR pole being formed from the second portion of the PMR pole layer.

14. The method of claim 13 wherein the step of removing the first portion of the PMR pole layer further includes:
performing an ion mill.

15. The method of claim 14 wherein the step of removing the first portion of the PMR pole layer further includes:
milling the second portion of the PMR pole layer.

16. The method of claim 12 wherein the angle is not more than three degrees.

17. The method of claim 7 wherein the photoresist layer further includes a dyed photoresist layer.

18. The method of claim 17 wherein the PMR pole providing further includes:
depositing a PMR pole layer, a portion of the PMR pole layer residing in the trench.

19. The method of claim 17 wherein the angle is not more than ten degrees.

20. The method of claim 19 wherein the angle is at least seven degrees and not more than nine degrees.

21. A method for providing a magnetic transducer comprising:
providing a perpendicular magnetic recording (PMR) pole layer;
providing a photoresist layer on the PMR pole layer, the photoresist layer having a surface;
exposing the photoresist layer over a focus range to form a photoresist mask having a trench therein, the trench having a base and at least one sidewall having an angle with respect to a normal to the surface, the angle being greater than zero and not more than three degrees, the base exposing a portion of the PMR pole layer, the focus range corresponding to a plurality of focus distances, the focus range being selected to correspond to the angle to be formed;
providing a hard mask layer, a portion of the hard mask layer residing in the trench;
removing the photoresist mask, a hard mask including the portion of the hard mask remaining after the removing of the photoresist mask;
performing an ion mill on the PMR pole layer.

22. A method for providing a magnetic transducer comprising:
providing a dyed photoresist layer having a surface;
exposing the dyed photoresist layer over a focus range to form dyed photoresist mask having a trench therein, the trench having at least one sidewall forming an angle with a normal to the surface, the angle being greater than seven degrees and not more than nine degrees, the focus range corresponding to a plurality of focus distances, the focus range being selected to correspond to the angle to be formed;
providing a perpendicular magnetic recording (PMR) pole layer, a portion of the PMR pole layer residing in the trench;
removing the dyed photoresist mask, the portion of the PMR pole layer remaining after the removing of the dyed photoresist mask;
trimming the portion of the PMR pole layer.

23. A method for providing a magnetic head comprising:
providing a photoresist layer having a surface;
exposing the photoresist layer over a focus range to form a photoresist mask having a trench therein, the trench having at least one sidewall forming an angle with a normal to the surface, the angle being nonzero, the focus range corresponding to a plurality of focus distances, the focus range being selected to correspond to the angle to be formed; and
providing a perpendicular magnetic recording (PMR) pole utilizing the trench.

* * * * *